United States Patent
Takaike

(10) Patent No.: US 7,704,792 B2
(45) Date of Patent: Apr. 27, 2010

(54) SEMICONDUCTOR DEVICE AND METHOD OF MANUFACTURING THE SAME

(75) Inventor: Eiji Takaike, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 6 days.

(21) Appl. No.: 12/195,619

(22) Filed: Aug. 21, 2008

(65) Prior Publication Data

US 2009/0057898 A1    Mar. 5, 2009

(30) Foreign Application Priority Data

Sep. 5, 2007    (JP)    ............................. 2007-230323

(51) Int. Cl.
*H01L 21/00*    (2006.01)
*H01L 23/48*    (2006.01)

(52) U.S. Cl. ...................................... 438/106; 257/734

(58) Field of Classification Search ...................... None
See application file for complete search history.

(56) References Cited

FOREIGN PATENT DOCUMENTS

JP    2002-237567 A1    8/2002

*Primary Examiner*—Scott B Geyer
(74) *Attorney, Agent, or Firm*—Kratz, Quintos & Hanson, LLP

(57) ABSTRACT

An insulating layer having an opening from which an electrode pad of a device is exposed is formed on the surface of a semiconductor substrate having the device fabricated therein, and an external terminal pad defined by a portion of a conductor layer formed on the insulating layer is connected to the electrode pad by means of a bonding wire. Further, a conductor post is formed on the external terminal pad, and an encapsulation resin layer is formed to coat a region on the semiconductor substrate in which the conductor post is formed, and to expose a top portion of the conductor post. An external connecting terminal is bonded to the top portion of the conductor post.

9 Claims, 8 Drawing Sheets

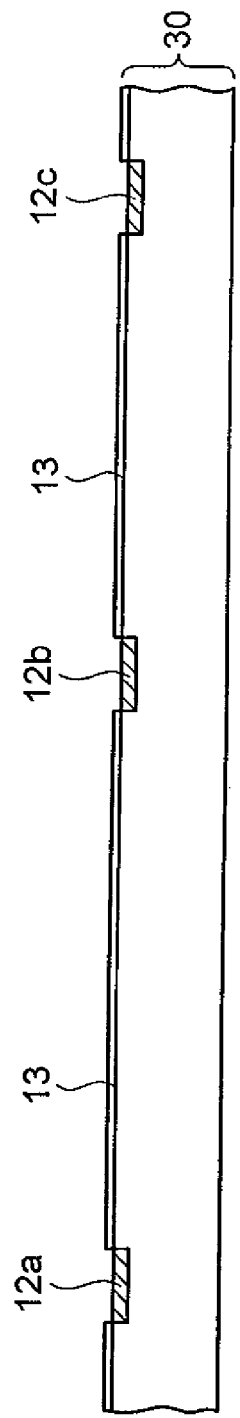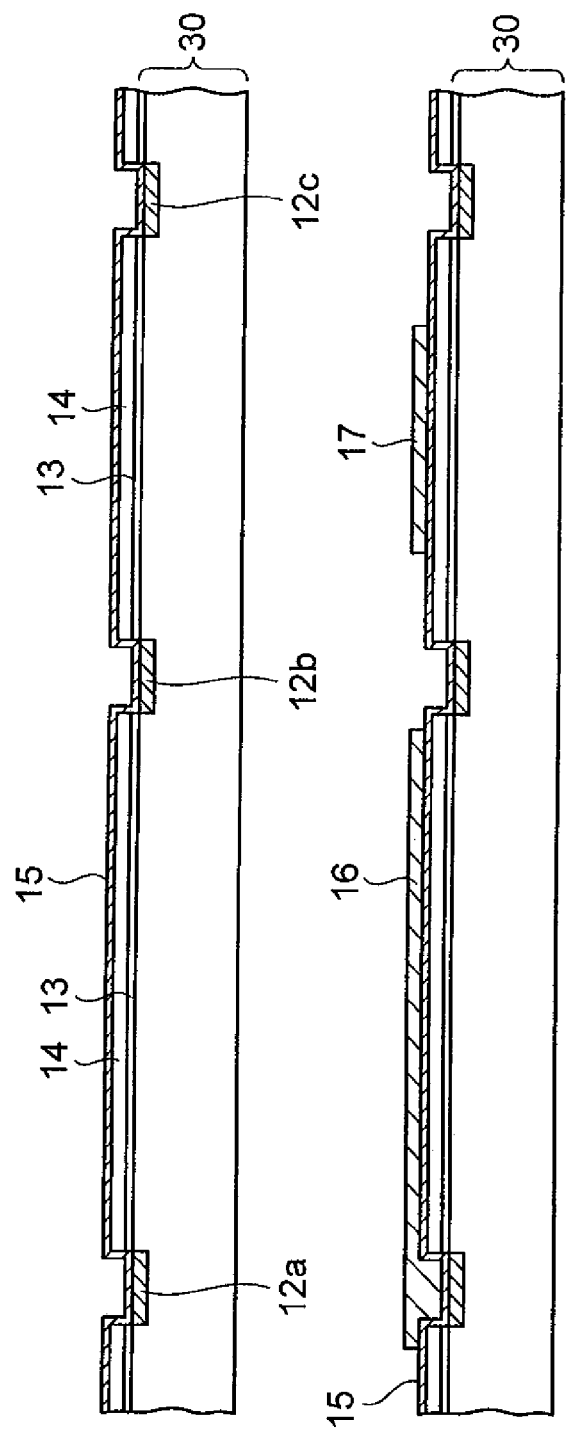
FIG. 1A
FIG. 1B
FIG. 1C

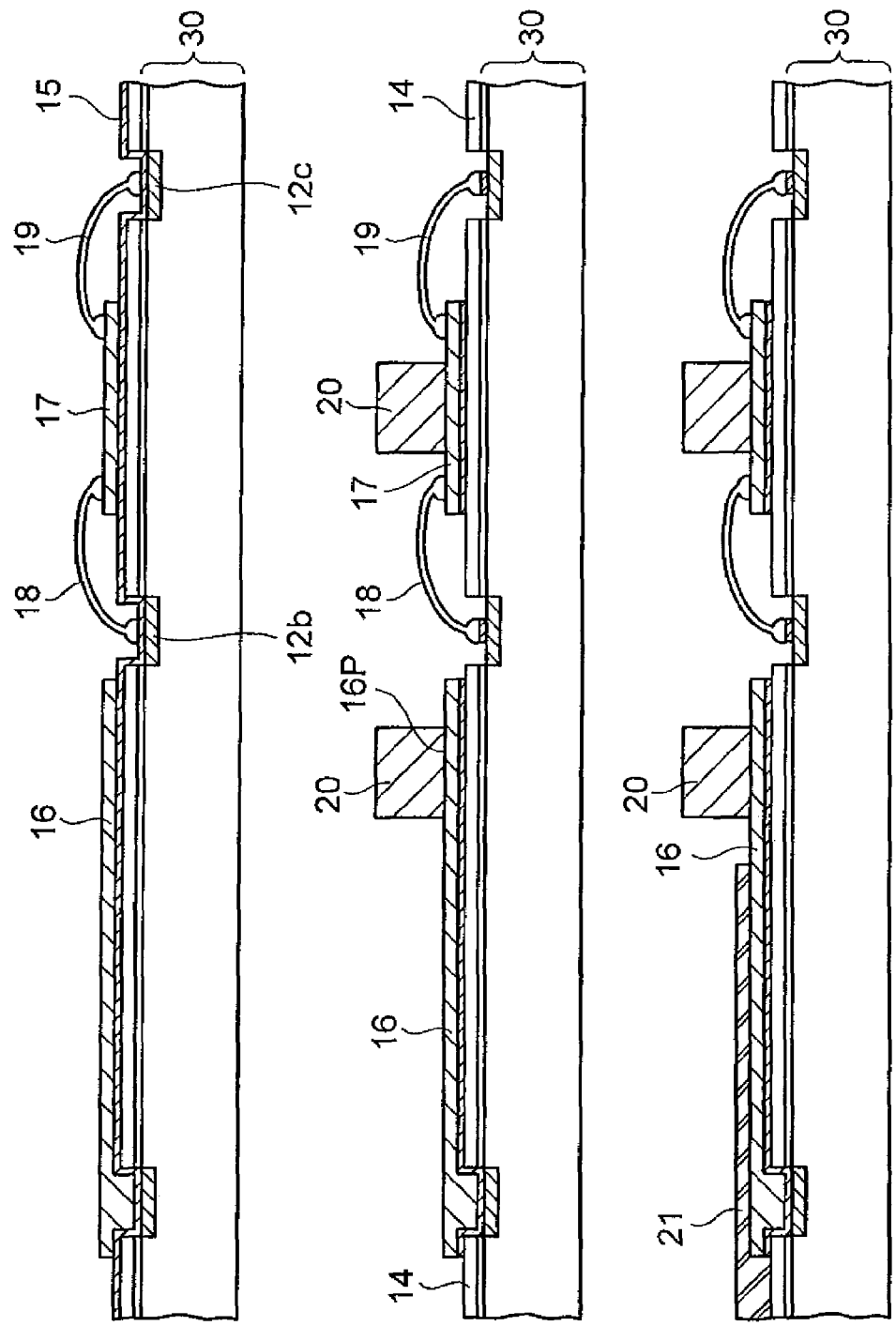

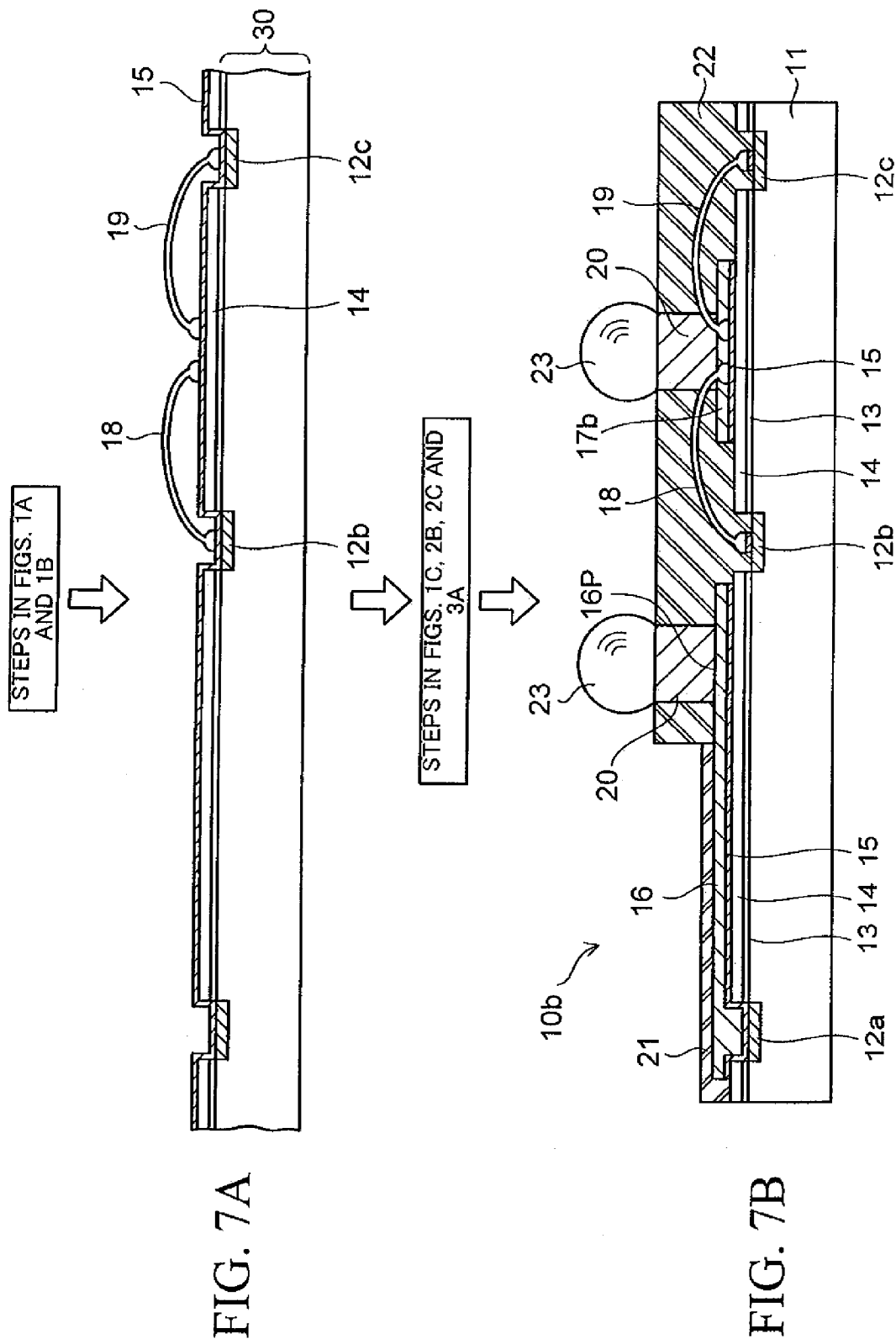

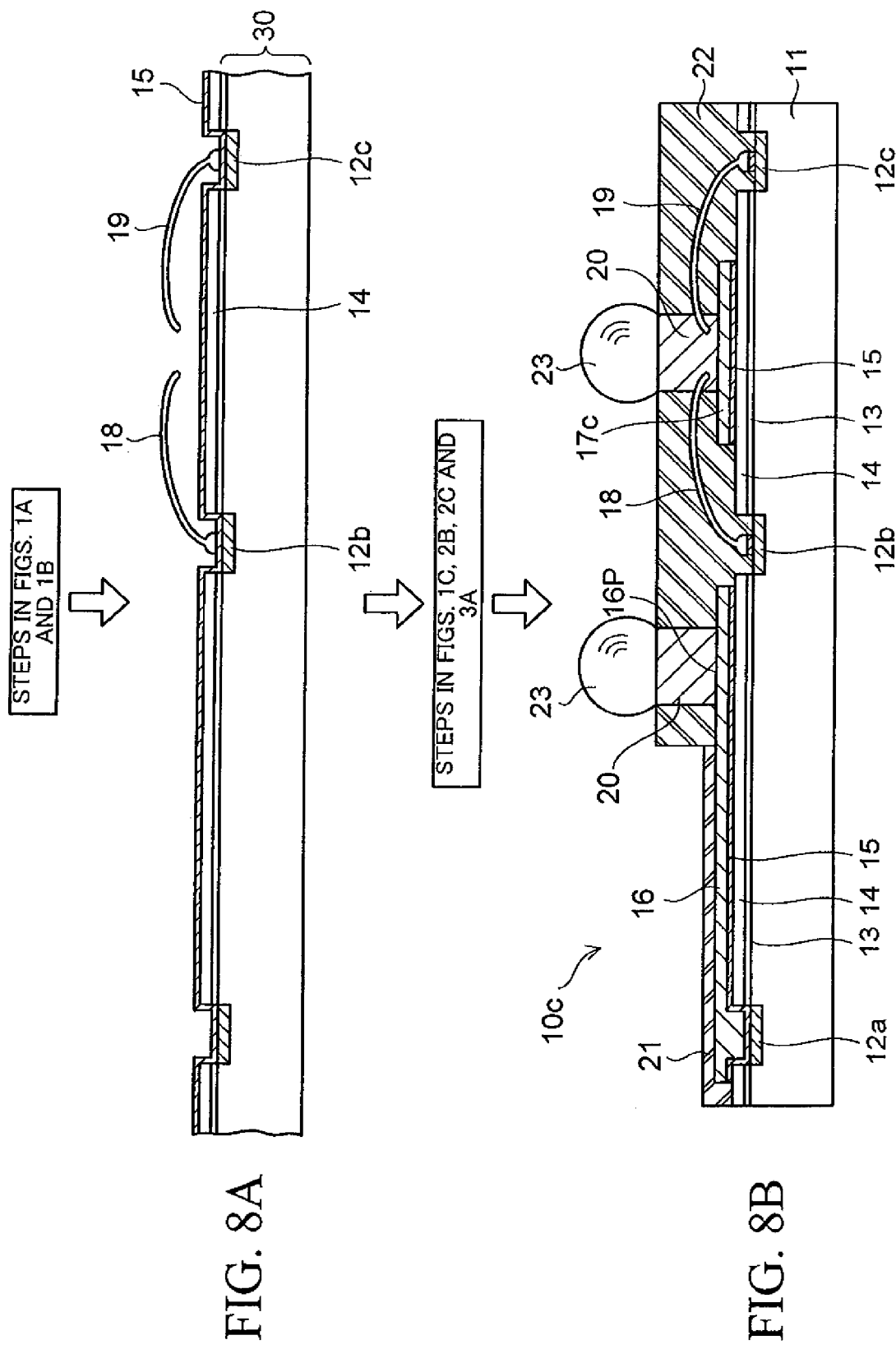

SEMICONDUCTOR DEVICE AND METHOD OF MANUFACTURING THE SAME

CROSS-REFERENCE TO RELATED APPLICATIONS

This application is based on and claims priority of Japanese Patent Application No. 2007-230323 filed on Sep. 5, 2007, the entire contents of which are incorporated herein by reference.

BACKGROUND OF THE INVENTION (a) Field of the Invention

The present invention relates to a semiconductor device and a method of manufacturing the same, and more particularly to a technology useful for efficient rearrangement of an external connecting terminal in a wafer level package having a plurality of devices fabricated therein.

(b) Description of the Related Art

A semiconductor device (or chip) such as an IC or an LSI for use in electronic equipment or apparatuses has recently become higher in packaging density and thus larger in capacity accompanied by an increase in the need for miniaturization and high performance of the electronic equipment or apparatuses. A package for mounting a semiconductor chip, in turn, has also been designed to be more compact (or slimmer), greater in the number of pins, higher in density, and so on. Also, an MCP (multi chip package) having a plurality of semiconductor chips mounted on a substrate has come into practical use, and in particular, a stack-type MCP is in general use. Moreover, a technology for further miniaturization, such as a CSP (chip size package), is required for mounting semiconductor chips.

For a package for mounting a plurality of semiconductor devices (i.e., active devices), the utilization of a wafer level package enables the formation of fine wiring, and hence makes a contribution to an increase in density or the like. In a typical wafer level package, an insulating film is made of a passivation film, a polyimide resin or the like, and is formed as a protection film on a surface of a wafer into which devices are fabricated; the insulating film having an opening is formed in a desired position therein; a conductor layer (i.e., a rewiring layer) is formed on the insulating film, and allows an electrode pad (i.e., a wiring layer) of each of the devices to communicate with the outside of the package through the opening of the insulating film; a conductor post is further disposed on the rewiring layer in a portion where a terminal is formed; the entire surface of the wafer on which the conductor post is formed is encapsulated with an encapsulation resin (but so as to expose the top portion of the conductor post to the outside); and the top portion of the conductor post is bonded to an external connecting terminal (e.g., a solder ball or the like).

One example of the technologies related to the above conventional technology is disclosed in Japanese unexamined Patent Publication (Kokai) 2002-237567. In a stack-type MCP (semiconductor device) disclosed in this publication, leads (stitches) or wirings are formed on the surface of an insulating layer of a substrate in which a semiconductor chip is encapsulated. The stitches include: stitches connected to pad electrodes by bonding wires on the semiconductor chip; and extra stitches disposed on the surface of the insulating layer.

As mentioned above, for the package for mounting the plurality of semiconductor devices, the utilization of the wafer level package enables the formation of fine wiring. Meanwhile, for rearrangement (i.e., the rearrangement of the external connecting terminal) on the wafer level, wiring formation (i.e., rewiring) in a single layer of conductors is desirable in terms of cost.

However, conductors are divided into wirings of different attributes, such as a power supply line for feeding a desired power supply voltage to each device, a ground line, and a signal line for conveying data, a control signal or the like. Furthermore, even the signal lines of the same attribute include various wirings, such as a wiring for 5 V and a wiring for 3.3 V, according to a supply voltage. Likewise, even the signal lines of the same attribute include various wirings, such as a wiring for an analog signal and a wiring for a digital signal, according to a type of signal. Thus, if the conductors (i.e., the wirings) are designed under constraints (e.g., line/space, etc.) on connection information, design, or the like that conflict with each other, a problem can possibly arise in that rewiring in a single layer of conductor becomes impossible regardless of the number of pins (i.e., the number of external connecting terminals installed) of the package.

SUMMARY OF THE INVENTION

An object of the present invention is to provide a semiconductor device and a method of manufacturing the same, capable of achieving wiring formation (i.e., rewiring) in a single layer of conductor and thus contributing to a reduction in cost.

In order to attain the above object, according to one aspect of the present invention, there is provided a semiconductor device including: a semiconductor substrate having a device fabricated therein; an insulating layer formed on a surface of the semiconductor substrate, and having an opening from which an electrode pad of the device is exposed; a bonding wire via which the electrode pad is connected to an external terminal pad defined by a portion of a conductor layer formed on the insulating layer; a conductor post formed on the external terminal pad; an encapsulation resin layer formed to coat a region on the semiconductor substrate in which the conductor post is formed, and to expose a top portion of the conductor post; and an external connecting terminal bonded to the top portion of the conductor post.

According to the semiconductor device according to this aspect, the electrode pad of the device fabricated in the semiconductor substrate is connected via the bonding wire to the external terminal pad (the conductor post and the external connecting terminal) defined by a portion of the conductor layer. Therefore even a wafer level package enables achieving rearrangement of the external connecting terminal on the wafer level in a single layer of conductor (conductor layer). Namely, this is advantageous in terms of cost because wiring formation (i.e., rewiring) in a single layer of conductor is possible.

Also, according to another aspect of the present invention, there is provided a method of manufacturing a semiconductor device, including preparing a semiconductor wafer having a plurality of devices fabricated therein; forming an insulating layer having a plurality of openings from which a plurality of electrode pads of each device are exposed, on a surface of the semiconductor wafer on the side in which the devices are fabricated, and further forming a seed layer on the insulating layer; forming a wiring layer in a desired shape by patterning, in a region of the seed layer containing some of the plurality of openings, and forming an external terminal pad in another region of the seed layer; connecting a portion of the seed layer on each of the electrode pads exposed from remaining ones of the plurality of openings, to the external terminal pad by means of a bonding wire; forming conductor posts on a terminal formation portion of the wiring layer and the external terminal pad, respectively; forming a protection film to coat the wiring layer, in a region in which the conductor posts are not formed; encapsulating with an encapsulation resin a remaining portion which is not coated with the protection film, while exposing top portions of the conductor posts; and bonding external connecting terminals to the top portions of the conductor posts, and dividing the semiconductor wafer having the external connecting terminals bonded thereto into individual device units.

Description is given with reference to embodiments of the present invention with regard to other structural features and advantages and the like based thereon, of the semiconductor device and the method of manufacturing the same according to the present invention.

BRIEF DESCRIPTION OF THE DRAWINGS

FIGS. 1A to 1C are sectional views showing manufacturing steps for a semiconductor device of CSP structure according to a first embodiment of the present invention;

FIGS. 2A to 2C are sectional views showing manufacturing steps following the manufacturing steps shown in FIGS. 1A to 1C;

FIGS. 7A and 7B are sectional views showing part of manufacturing steps for a semiconductor device according to a third embodiment of the present invention; and FIGS. 8A and 8B are sectional views showing part of manufacturing steps for a semiconductor device according to a fourth embodiment of the present invention.

DESCRIPTION OF THE PREFERRED EMBODIMENTS

Description is given below with regard to preferred embodiments of the present invention with reference to the accompanying drawings.

First Embodiment (see FIGS. 1A to 5)

FIGS. 1A to 3B illustrate, in sectional view, manufacturing steps for a semiconductor device of CSP structure according to the first embodiment of the present invention.

Figure 3A:
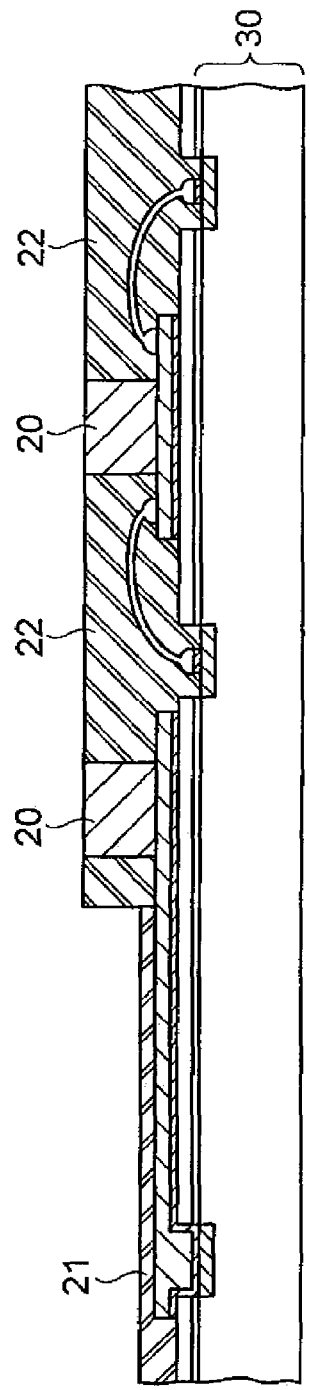
FIGS. 3A and 3B are sectional views showing manufacturing steps following the manufacturing steps shown in FIGS. 2A to 2C.
Figure 3B:
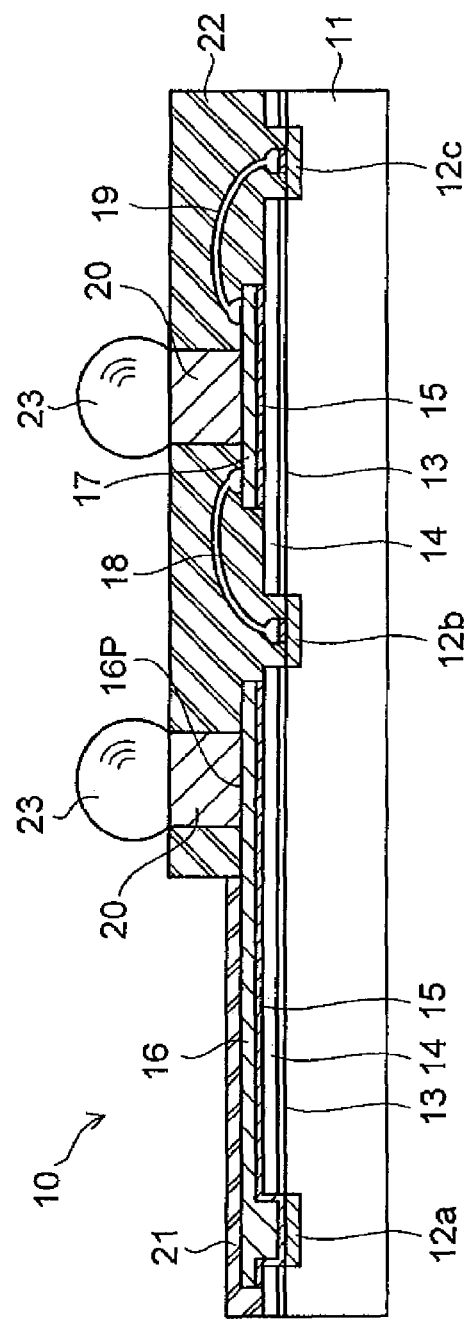

Referring first to FIG. 3B, reference numeral 10 denotes the semiconductor device (CSP) according to the first embodiment; and 11, a semiconductor substrate having devices fabricated therein, and the semiconductor substrate 11 constitutes one of portions into which a semiconductor wafer to be described later is cut (or divided). Also, reference numerals 12a, 12b and 12c denote electrode pads defined by partial regions of conductors formed on the devices; 13, a passivation film formed on the surface of the substrate 11 in which the electrode pads 12a, 12b and 12c are formed; 14, an insulating film formed on the passivation film 13; 15, a thin metal film formed in a desired shape on the insulating film 14 by patterning; 16, a rewiring layer formed on the thin metal film 15 in a partial region thereof; 16P, a terminal formation portion of the rewiring layer 16; 17, a pad defined on the thin metal film 15 by another region thereof; 18 and 19, bonding wires via which the electrode pads 12b and 12c are respectively connected to the pad 17 on the thin metal film 15; 20, conductor posts respectively formed on the terminal formation portion 16P of the rewiring layer 16 on one side, and on the pad 17 at the center on the other side; 21, a protection film formed coating the rewiring layer 16; 22, an encapsulation resin layer formed on the surface on the side on which the conductor posts 20 are formed, coating the remaining portion of the surface which is not coated with the protection film 21 (except that the top portions of the conductor posts 20 are exposed); and 23, external connecting terminals bonded to the exposed top portions of the conductor posts 20.

The pad 17 having the conductor post 20 formed thereon is hereinafter referred to as a "post pad" for the sake of convenience, in the respect that the pad 17 is distinguished from the electrode pads 12a, 12b and 12c of the devices fabricated in the semiconductor substrate 11.

In the first embodiment, the post pad 17 is utilized as a power supply plane or a ground plane. Thus, the electrode pads 12b and 12c connected to the post pad 17 via the wires 18 and 19 are assigned as power supply (or ground) terminals for the devices fabricated in the substrate 11. In other words, wires 18 and 19 respectively bonded to the two power supply (or ground) electrode pads 12b and 12c are collectively connected to one and the same power supply plane (or ground plane). The two wires 18 and 19 are illustrated as connected to the electrode pads 12b and 12c, respectively, as shown in FIG. 3B; however, three or more wires may be connected to the electrode pads (see FIG. 4), depending on the relative positions of the power supply (or ground) electrode pads and the post pad. On the other hand, the electrode pad 12a connected to the rewiring layer 16 is assigned as a signal terminal for the devices fabricated in the substrate 11.

As shown in FIG. 3B, the semiconductor device 10 according to the first embodiment is characterized in that each of the wires 18 and 19 having one end connected to each of the electrode pads 12b and 12c of the devices fabricated in the substrate 11 has another end bonded to the post pad 17 outside from the portion where conductor post 20 is on. Also, the first embodiment is intended to mount the device 10 together with another semiconductor device (or chip) on a printed circuit board or the like, and to thereby construct an SIP (system in package), as is described later.

As for the materials for and forms of structural members of the semiconductor device 10 according to the first embodiment and the like, description thereof is omitted here, and is given as appropriate in the following description of a manufacturing method for the semiconductor device 10.

Description is given below with reference to FIGS. 1A to 3B with regard to the method of manufacturing the semiconductor device 10 of CSP structure according to the first embodiment.

First, in the first step (FIG. 1A), it is prepared a wafer 30 having a plurality of devices (not shown) fabricated therein. For example, this step involves subjecting a silicon (Si) wafer of 8 inches in diameter (with a thickness of about 725 μm) to a desired device process; then, forming the passivation film 13 as a protection film, made of silicon nitride (SiN), phosphorus glass (PSG) or the like, on the surface of the wafer (in the illustrated example, on the upper side); and removing portions of the passivation film 13 corresponding to the electrode pads 12a, 12b and 12c defined by portions of wiring layers made of aluminum (Al), formed in large numbers in a desired pattern on the devices (namely, forming openings in the corresponding portions). A laser process using a YAG laser, an excimer laser or the like, for example, is employed for the formation of the openings in the passivation film 13. Thereby, the wafer 30 having its surface coated with the passivation film 13 and having the electrode pads 12a, 12b and 12c exposed, as shown in FIG. 1A, is fabricated. Incidentally, in some cases, without providing the passivation film 13 on the surface of the wafer, an insulating film to be formed at the next step may be made to function as the passivation film as well.

In the next step (FIG. 1B), the insulating film 14 is formed on the passivation film 13 of the wafer 30, and the thin metal film 15 as a seed layer on the entire surface on the side on which the insulating film 14 is formed.

First, the insulating film (polyimide resin layer) 14 is formed by photolithography. Specifically, photolithography involves: applying a coating of a photoresistive polyimide resin as a resist to the surface of the wafer 30; subjecting the polyimide resin (i.e., the resist) to a soft bake (i.e., pre-bake) processing; then subjecting the resist to exposure and development (namely, subjecting the resist to patterning) using a mask (not shown); and further subjecting the resist to a hard bake (i.e., post-bake) processing, thereby forming the insulating film (i.e., a polyimide resin layer) 14 having openings in predetermined positions, as shown in FIG. 1B. On this case, the resist patterning is carried out in accordance with the shapes of the electrode pads 12a, 12b and 12c. Thus, the exposure and development cause portions of the polyimide resin layer 14 corresponding to the electrode pads 12a, 12b and 12c to be removed, thereby forming the openings extending to the electrode pads, as shown in FIG. 1B.

Then, the thin metal film (i.e., the seed layer) 15 is formed by sputtering on the entire surface on the side on which the insulating film (i.e., the polyimide resin layer) 14 is formed. The thin metal film 15 has a double-layer structure formed of a chromium (Cr) or titanium (Ti) layer which forms an adhesive bonding metal layer, and a copper (Cu) or gold (Au) layer stacked on the Cr or Ti layer. The thin metal film 15 can be formed by sputter deposition of Cr or Ti on the entire surface (namely, the adhesive bonding metal layer: the Cr or Ti layer), and further, sputter deposition of Cu or Au on top of the Cr or Ti layer (namely, the Cu or Au layer). Here, an upper layer portion of the thin metal film 15 is formed in a thickness around a few angstroms (for the Cu layer) or in a thickness of a few tens of angstroms (for the Au layer). The thin metal film (i.e., the seed layer) 15 formed in this manner functions as a power feed layer for an electroplating processing required for the formation of rewiring, the conductor posts or the like at the later steps.

Incidentally, this step uses the photoresistive polyimide resin as the insulating film 14 formed on the surface of the wafer 30; however, it is to be, of course, understood that the material for the insulating film 14 is not limited to the photoresistive resin, and, for example, resins such as a non-photoresistive polyimide or epoxy resin may be used. In this case, a laser process is used for the formation of the required openings because the photolithography can not be used.

In the next step (FIG. 1C), a resist pattern is formed in a desired shape, and the rewiring layer 16 and the post pad 17 are formed by electroplating.

First, a resist layer (not shown) is formed by: subjecting the surface of the thin metal film 15 to baking for dehydration; applying a coating of a photoresist in liquid form to the surface; drying the photoresist; and then, subjecting the photoresist to exposure and development (namely, subjecting the photoresist to patterning) using a mask (not shown). The photoresist patterning is carried out in accordance with the shapes of the rewiring layer 16 and the post pad 17 to be formed.

Then, the rewiring layer 16 and the post pad 17 made of Cu are formed in a thickness around a few tens of micrometers, using as a mask the resist layer formed by patterning, by electroplating the surface of the thin metal film 15 with copper (Cu) with the use of the thin metal film (i.e., the seed layer) 15 as the power feed layer. Thereafter, the photoresist (i.e., the resist layer) is removed using a liquid resist stripper containing an organic solvent.

Incidentally, this step uses the photoresist in liquid form as a patterning material; however, a photoresistive dry film may be used for the formation of the desired resist pattern. In this case, the resist layer is formed by: cleaning the surface of the thin metal film 15 (i.e., the surface of the Cu or Au layer); then, laminating a dry film (of about 100 μm thick) to the surface by thermocompression bonding; and subjecting the dry film to exposure and development using a mask (not shown) formed in a desired shape by patterning (namely, subjecting the dry film to patterning). After the formation of the rewiring layer 16 and the post pad 17, the dry film (i.e., the resist layer) is delaminated and removed using an alkaline chemical liquid such as sodium hydroxide or a monoethanolamine-base liquid.

In the next step (FIG. 2A), the electrode pads 12b and 12c of the devices fabricated in the wafer 30 (i.e., the thin metal film 15 on the electrode pads) are connected to the post pad 17 on the thin metal film 15, respectively, using the bonding wires 18 and 19. Ball bonding method (i.e., thermocompression bonding method in combination with ultrasonic waves) can be used for the connection. First, the tip of a wire bonding tool (i.e., a capillary holding a gold (Au) or copper (Cu) wire for bonding in a hollow portion) is brought into contact with the thin metal film 15 (in a target position) on the electrode pad 12b (or 12c), and an molten Au or Cu ball on the tip of the tool is bonded to the preheated target position of the thin metal film 15 by friction attributable to diffusion and ultrasonic vibrations produced under heat and pressure. At this time, a preheating temperature is about 150 to 200 degrees. Then, the tip of the tool is brought into contact with the post pad 17 in a predetermined position. Likewise, an Au or Cu ball is bonded to the post pad 17 in the predetermined position. At this time, a bonding position (i.e., the predetermined position) is selected at a position in the vicinity of the periphery of the post pad 17.

In the next step (FIG. 2B), a resist pattern is formed in a desired shape, and the conductor posts 20 is formed by electroplating. Further, the formation of a barrier metal layer, a back grinding processing, and the like are carried out.

First, a resist layer (not shown) is formed by: subjecting the surface on the side on which the wires 18 and 19 are bonded (i.e., the surfaces of the thin metal film 15, the rewiring layer 16 and the post pad 17) to baking for dehydration; applying a coating of a photoresist in liquid form to the surface; drying the photoresist; and then, subjecting the photoresist to exposure and development (i.e., subjecting the photoresist to patterning) using a mask (not shown). The photoresist patterning is carried out in accordance with the shape of the conductor post 20 to be formed.

Then, the conductor (Cu) posts 20 are formed in a height around 50 to 100 μm on the terminal formation portion 16P of the rewiring layer 16 and on the post pad 17 at the center by electroplating the surfaces of the rewiring layer 16 and the post pad 17 with copper (Cu) with the use of the thin metal film (i.e., the seed layer) 15 as the power feed layer, using as a mask the resist layer formed by patterning.

Further, the barrier metal layer (not shown) is formed on the top portions of the Cu posts 20 by electroplating. The barrier metal layer (Ni/Pd/Au) can be formed, for example, by: plating the surface of the Cu post 20 with nickel (Ni) for improvement in adhesion with the use of the seed layer 15 functioning as the power feed layer; further plating the Ni layer with palladium (Pd) for improvement in conductivity; and then plating the Pd layer with gold (Au). Alternatively, without the provision of the Pd layer, the Au layer may be formed directly on the Ni layer (Ni/Au). At this time, the surface on the side on which the wires 18 and 19 are bonded (in the illustrated example, on the upper side) is substantially in flat condition with the surfaces of the Cu posts 20 (and the barrier metal layer) and the surface of the photoresist (i.e., the resist layer).

Further, although not specifically shown, the back surface of the wafer (in the illustrated example, the bottom surface thereof) is ground using a known grinding device so as to obtain the thickness of the wafer 30 around 250 to 300 μm (i.e., a back grinding processing). At this time, the upper side surface is substantially flat, which in turn facilitates chucking the upper side surface prior to grinding and hence enables thinning the back side surface of the wafer 30 as chucked in this manner to a predetermined thickness.

After this, the photoresist (i.e., the resist layer) is removed using a liquid resist stripper containing an organic solvent, and the exposed thin metal film (i.e., the seed layer) 15 is removed by wet etching. Specifically, the upper layer portion (i.e., the Cu or Au layer) of the seed layer 15 is removed by an etchant that dissolves Cu or Au, and then the lower layer portion of the thin metal film 15 (i.e., the Cr or Ti layer) is removed by an etchant that dissolves Cr or Ti. Thereby, the insulating film (i.e., the polyimide resin layer) 14 is exposed as shown in FIG. 2B. After this, predetermined surface cleaning or the like is carried out.

Incidentally, when the etchant that dissolves Cu is used, Cu that forms the rewiring layer 16 and the post pad 17 is likewise removed and thus the conductor pattern seems to be disconnected; however, actually, such a disadvantage does not occur. The reason is that, as mentioned above, the upper layer portion of seed layer 15 is formed by sputtering of Cu or Au and thus the film thickness is around a few angstroms, while the rewiring layer 16 and the post pad 17 are formed by Cu electroplating and thus the layer thickness is around a few tens of micrometers. Therefore, even if Cu or Au of the thin metal film 15 is completely removed, Cu of the rewiring layer 16 and the post pad 17 is removed only at the surface, so that the conductor pattern is not disconnected.

In the next step (FIG. 2C), the polyimide resin layer 21 as the protection film is formed on the rewiring layer 16. This can be formed by photolithography in the same manner as the processing for "the formation of the insulating film (i.e., the polyimide resin layer) 14" performed in the step shown in FIG. 1B. In the illustrated example, a partial region of the rewiring layer 16 (i.e., the region where the Cu post 20 is formed) is not coated with the polyimide resin layer 21; however, this region is coated with a similar protection film (i.e., encapsulation resin layer) in the next step, which in turn presents no problem.

In the next step (FIG. 3A), the surface of the wafer 30 on the side on which the conductor posts 20 are formed is coated with a resin (the encapsulation resin layer 22 is formed). Specifically, the resin coats the remaining portion of the surface which is not coated with the polyimide resin layer 21 (while exposing the top portions of the Cu posts 20 (the barrier metal layer)). This encapsulation can be accomplished, for example, in the following manner.

First, upper and lower encapsulation molds are prepared and heated to about 175 degrees. Then, a resin film is attached to the upper mold, the wafer 30 is mounted in a cavity of the lower mold, and further, an epoxy resin in tablet form, having high adhesion, is mounted thereon as an encapsulation resin. Then, the epoxy resin is melted by heat of the encapsulation mold and pressure applied from a press so as to spread over the entire surface of the wafer and the epoxy resin is cured while being held in the mold. After this, the wafer 30 is removed from the mold. At this time, the wafer 30 is integral with the resin film, and thus the resin film is peeled from the wafer 30. Thereby, as shown in FIG. 3A, the wafer 30 having its surface coated with the epoxy resin layer 22 (except for the portion coated with the polyimide resin layer 21) and having the top portions of the Cu posts 20 exposed, is fabricated.

In the final step (FIG. 3B), a coating of a flux as a surface treatment agent is applied to the exposed top portions of the Cu posts 20 (i.e., the barrier metal layer), then the solder ball 23 is mounted for use as the external connecting terminal on the tops of the Cu posts 20, and the solder ball 23 is fixed by reflow at a temperature of about 240 to 260 degrees. After that, the surface is cleaned to remove the flux.

After this, the wafer 30 in together with the encapsulation resin layer 22 and the protection film 21 is cut by a dicer or the like, to be divided into individual semiconductor devices (or chips). Thereby, the fabrication of the semiconductor device 10 of CSP structure according to the first embodiment is accomplished.

Figure 4:
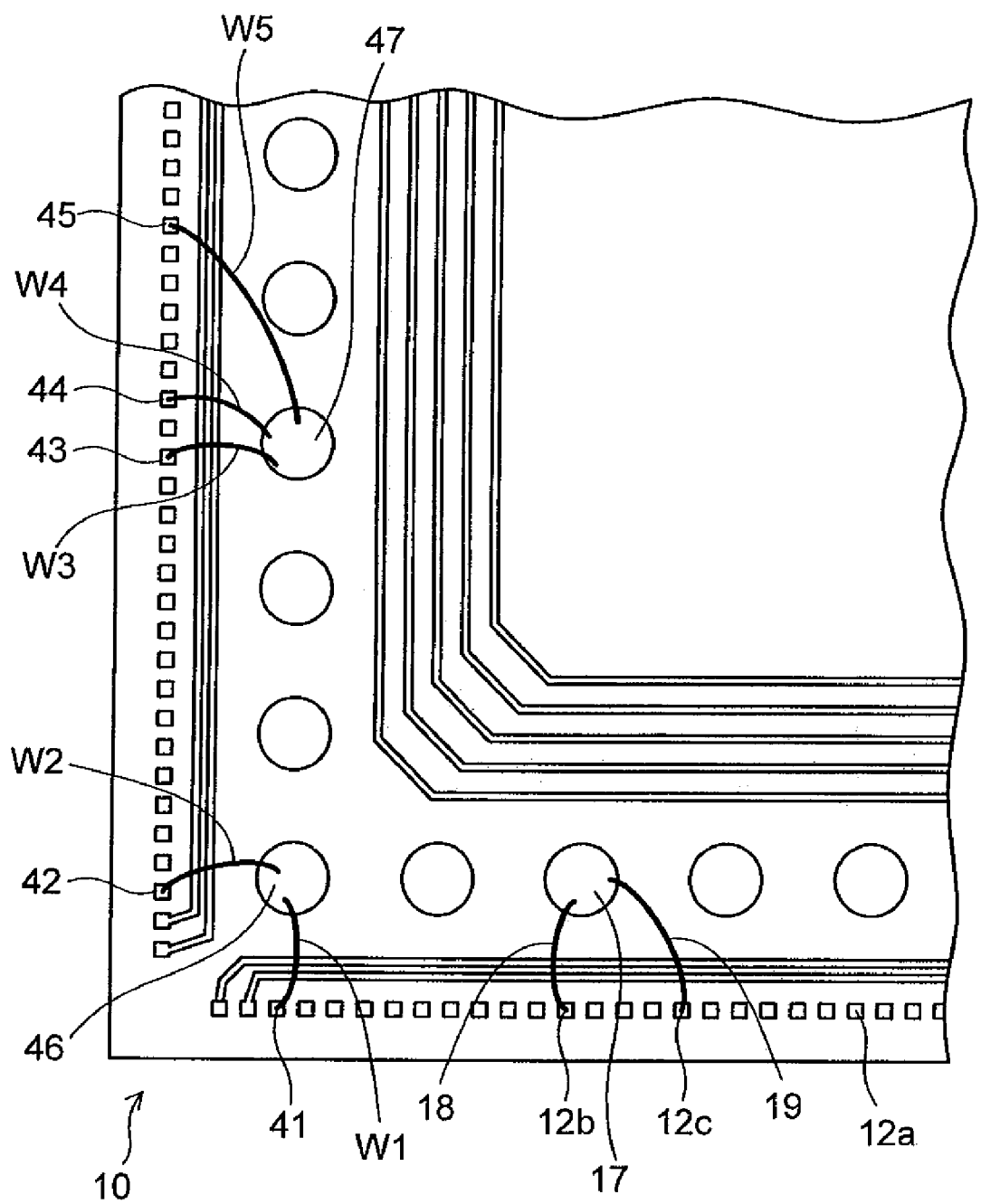
FIG. 4 is a plan view schematically showing the configuration of the principal part of the semiconductor device according to the first embodiment.

FIG. 4 illustrates, in schematic plan view, the configuration of a principal part of the semiconductor device 10 according to the first embodiment, as observed immediately after "wire bonding" performed in the step shown in FIG. 2A. The electrode pads 12a, 12b and 12c of the devices fabricated in the wafer are arranged along the periphery of the device to be divided eventually (i.e., the semiconductor device 10) as shown in FIG. 4. The terminal formation portion 16P and the post pad 17 are likewise arranged along the periphery inside the region where these electrode pads are formed. Although not shown in FIG. 4, the terminal formation portion 16P is the portion defined by the partial region of the rewiring layer 16, the conductor posts 20 are finally formed respectively on the terminal formation portion 16P and the post pad 17, and further, the external connecting terminals 23 are bonded to the conductor posts 20. In other words, the device (i.e., the semiconductor device 10) has a "peripheral type" package structure in which the external connecting terminals are arranged along the periphery of the device. Incidentally, the external connecting terminals (i.e., the terminal formation portion 16P and the post pad 17) are arranged in a line, for sake of simplicity in the illustrated example.

Also, among the electrode pads, the electrode pads 12b and 12c are assigned as the power supply or ground terminals, while the electrode pad 12a is assigned as the signal terminal, as mentioned above. The signal electrode pad 12a is connected to the terminal formation portion 16P via the rewiring layer 16 (not shown), while the power supply or ground electrode pads 12b and 12c are collectively connected to the common post pad 17 via the bonding wires 18 and 19, respectively. Likewise, other power supply or ground electrode pads 41, 42, 43, 44 and 45 are also collectively connected to post pads (i.e., power supply planes or ground planes) 46 and 47 via bonding wires W1, W2, W3, W4 and W5, respectively.

As described above, according to the semiconductor device 10 of CSP structure according to the first embodiment and the method of manufacturing the same (see FIGS. 1A to 4), the electrode pads 12b and 12c of the device fabricated in the semiconductor substrate 11 are connected to the post pad 17 (the Cu post 20 and the external connecting terminal 23) defined by a portion of the conductor (Cu) layer, via the bonding wires 18 and 19, respectively, and thus, even a wafer level package enables achieving rearrangement of the external connecting terminal 23 on the wafer level in the conductor layer (a single layer of conductor). In other words, this enables achieving a reduction in cost because desired rewiring in a single layer of conductor is possible.

Also, in the device (or chip) 10, the portion coated with the protection film 21 is "thinly" formed as compared with the portion coated with the encapsulation resin layer 22 (i.e., the region where the external connecting terminal is formed), and thus, the "thinly" formed portion can be effectively utilized. As shown for example in FIG. 5, where the device 10 together with another semiconductor device (or chip) 50 is mounted in "face-down" form on a packaging board 51 such as a printed circuit board, the chip 50 can be disposed in space immediately under the "thin" portion of the device 10. In the illustrated example, the two devices 10 are prepared, the devices 10 are oppositely disposed with the "thin" portions close to each other, and the chip 50 is disposed in the space immediately under the "thin" portions of the devices 10. The "thin" portion of the device 10 can be effectively utilized for packaging as mentioned above, which in turn enables reducing an occupied area on the packaging board, as compared with a simple side-by-side lateral arrangement of three chips. In other words, where the packaging board 51 has a fixed area, a larger number of chips, including the device (or chip) 10, can be mounted, which in turn enables contributing to higher performance of an MCP (multi chip package).

Also, the adoption of such a packaging form (see FIG. 5) enables a reduction in a height dimension, as compared with a stack-type MCP for mounting a stack of two chips as disclosed in Japanese unexamined Patent Publication (Kokai) 2002-237567. In other words, the package can become slimmer.

Figure 5:
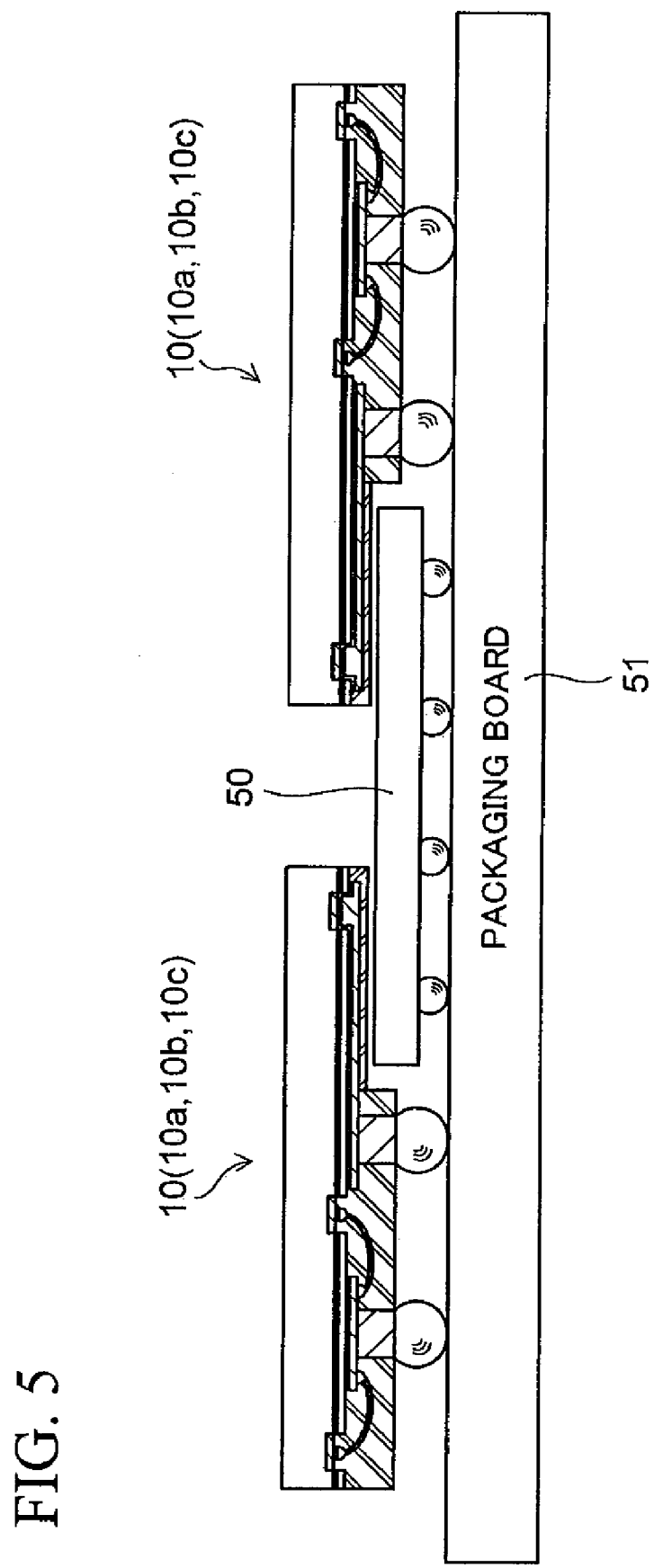
FIG. 5 is a sectional view showing an example of packaging of the semiconductor device according to the first embodiment.

Also, as for an SIP (system in package) which is one type of MCP, the technology of using an Au wire for connecting between chips is currently mainstream; however, this is not suitable for speedup because the length of wiring via the Au wire is relatively long. As opposed to this, when the chips 10 and 50 are mounted in the "face-down" form as shown in FIG. 5 and are connected via the solder ball (i.e., the external connecting terminal), the length of wiring becomes relatively short, which in turn is adaptable to speedup.

In the above-mentioned first embodiment (see FIG. 3B), one ends of the wires 18 and 19 are respectively connected to the electrode pads 12b and 12c of the devices fabricated in the semiconductor substrate 11, while the other ends thereof are bonded to the post pad 17 outside the conductor post 20. However, it is to be, of course, understood that a bonding form is not limited to this, and, besides this form, various forms of connections are possible. Description is given below with regard to some forms of connections.

Figures 6A, 6B:
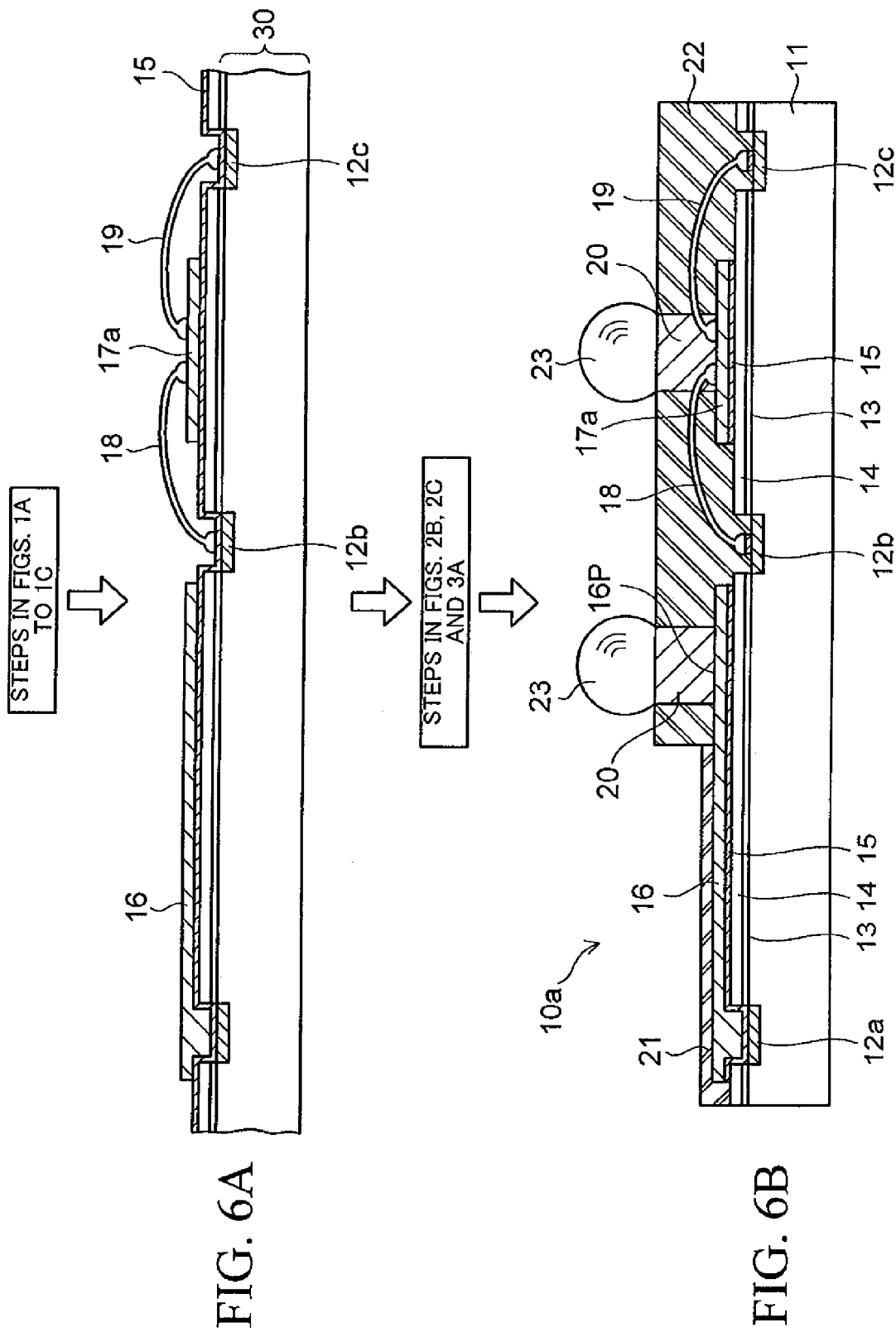
FIGS. 6A and 6B are sectional views showing part of manufacturing steps for a semiconductor device according to a second embodiment of the present invention.

Second Embodiment (see FIGS. 6A and 6B)

FIGS. 6A and 6B illustrate, in sectional view, part of manufacturing steps for a semiconductor device according to the second embodiment of the present invention.

The semiconductor device 10a according to the second embodiment is characterized in that one ends of the wires 18 and 19 are respectively connected to the electrode pads 12b and 12c (the seed layer 15 thereon) of the devices fabricated in the substrate 11, while the other ends thereof are bonded onto a post pad 17a at the portion where conductor post 20 is on. Manufacturing of the semiconductor device 10a according to the second embodiment is accomplished by: going through the same steps as the steps shown in FIGS. 1A to 1C; thereafter performing "wire bonding" in the same manner as the processing performed at the step shown in FIG. 2A (see FIG. 6A); further going through the same processings as the processings performed at the steps shown in FIGS. 2B and 2C and FIG. 3A; and then performing "the bonding of the solder ball" and "dicing" in the same manner as the processing performed at the step shown in FIG. 3B (see FIG. 6B).

Incidentally, for the bonding of the wires 18 and 19 at the step shown in FIG. 6A, the tip of the wire bonding tool is brought into contact with the post pad 17a in a predetermined position so that an Au ball is bonded to the post pad 17a, and, at this time, a bonding position (i.e., the predetermined position) is selected at a position in the vicinity of the center of the post pad 17a. Thereby, as shown in FIG. 6B, when the conductor post 20 is formed at the center of the post pad 17a, the connecting ends of the wires 18 and 19 are buried in the post 20.

According to the second embodiment, further advantages can be obtained as given below, in addition to the abovementioned advantageous effects achieved by the first embodiment. Specifically, the one ends of the wires 18 and 19 are connected to the electrode pads 12b and 12c of the substrate 11, while the other ends thereof are buried in the conductor post 20 and bonded to the post pad 17a, so that this structure enables a reduction in the size of the post pad 17a, as compared with "the structure in which the other ends of the wires 18 and 19 are bonded to the post pad 17 outside the conductor post 20," as is the case with the first embodiment. In other words, this reduction in size provides space correspondingly and thus enables a reduction in the pitch distance between the adjacent conductor posts 20, which is effective particularly for application to a package having a large number of pins, intended to achieve high density.

Third Embodiment (see FIGS. 7A and 7B)

FIGS. 7A and 7B illustrate, in sectional view, part of manufacturing steps for a semiconductor device according to the third embodiment of the present invention.

The semiconductor device 10b according to the third embodiment is characterized in that one ends of the wires 18 and 19 are respectively connected to the electrode pads 12b and 12c (the seed layer 15 thereon) of the devices fabricated in the substrate 11, while the other ends thereof are bonded to the seed layer 15 and buried in a post pad 17b formed on the seed layer 15, as shown in FIG. 7B. Manufacturing of the semiconductor device 10b according to the third embodiment is accomplished by: going through the same steps as the steps shown in FIGS. 1A and 1B; thereafter performing "wire bonding" in the same manner as the processing performed at the step shown in FIG. 2A (see FIG. 7A); further going through the same processings as the processings performed at the steps shown in FIG. 1C, FIGS. 2B and 2C and FIG. 3A; and then performing "the bonding of the solder ball" and "dicing" in the same manner as the processing performed at the step shown in FIG. 3B (see FIG. 7B).

Incidentally, in the third embodiment, for the bonding of the wires 18 and 19 at the step shown in FIG. 7A, the tip of the wire bonding tool is brought into contact with the seed layer 15 on the insulating film 14 in a predetermined position so that an Au or Cu ball is bonded to the seed layer 15, and, at this time, a bonding position (i.e., the predetermined position) is selected at a corresponding position inside the conductor post 20, as shown in FIG. 7B. Thereby, as in the case of the above-mentioned second embodiment, when the conductor post 20 is formed at the center of the post pad 17b, portions of the wires 18 and 19 are buried in the post 20 and the connecting ends thereof are buried in the post pad 17b.

According to the third embodiment, this embodiment can achieve the same advantageous effects as those achieved by the second embodiment, because the third embodiment has the same device configuration as the above-mentioned second embodiment.

Fourth Embodiment (see FIGS. 8A and 8B)

FIGS. 8A and 8B illustrate, in sectional view, part of manufacturing steps for a semiconductor device according to the fourth embodiment of the present invention.

The semiconductor device 10c according to the fourth embodiment is characterized in that one ends of the wires 18 and 19 are respectively connected to the electrode pads 12b and 12c (the seed layer 15 thereon) of the devices fabricated in the substrate 11, while the other ends are in a floating state (i.e., not connected to any portions) and buried in the conductor post 20 formed on a post pad 17c, as shown in FIG. 8B. Manufacturing of the semiconductor device 10c according to the fourth embodiment is accomplished by: going through the same steps as the steps shown in FIGS. 1A and 1B; thereafter performing "wire bonding" in the same manner as the processing performed at the step shown in FIG. 2A (see FIG. 8A); further going through the same processings as the processings performed at the steps shown in FIG. 1C, FIGS. 2B and 2C and FIG. 3A; and then performing "the bonding of the solder ball" and "dicing" in the same manner as the processing performed at the step shown in FIG. 3B (see FIG. 8B).

Incidentally, in the fourth embodiment, for the bonding of the wires 18 and 19 at the step shown in FIG. 8A, a second bonding (i.e., the connection to the seed layer 15 on the insulating film 14) is not required. However, each of the wires 18 and 19 is required to be held in such locations that the other end can be buried in the post 20 when the conductor post 20 is formed at the center of the post pad 17c at the later step.

According to the fourth embodiment, this embodiment has the merit of enabling a simplification of wire bonding processing in addition to the above-mentioned advantageous effects achieved by the second and third embodiments. This is because bonding is required only once for wire bonding (i.e., the connection to the seed layer 15 on the electrode pads 12b and 12c), thus further bonding is no more required. This contributes to a reduction in manufacturing cost.

What is claimed is:

1. A semiconductor device comprising:
   a semiconductor substrate having a device fabricated therein;
   an insulating layer formed on a surface of the semiconductor substrate, and having an opening from which an electrode pad of the device is exposed;
   a bonding wire via which the electrode pad is connected to an external terminal pad defined by a portion of a conductor layer formed on the insulating layer;
   a conductor post formed on the external terminal pad;
   an encapsulation resin layer formed to coat a region on the semiconductor substrate in which the conductor post is formed, and to expose a top portion of the conductor post; and
   an external connecting terminal bonded to the top portion of the conductor post.

2. The semiconductor device according to claim 1, wherein an end of the bonding wire is buried in the conductor post and connected to the external terminal pad.

3. The semiconductor device according to claim 1, wherein the conductor layer defining the external terminal pad has a double-layer structure formed of a lower layer and an upper layer, and an end of the bonding wire is connected to the lower layer and buried in the upper layer.

4. The semiconductor device according to claim 1, wherein one end of each of a plurality of bonding wires is connected to a corresponding one of a plurality of electrode pads of the device, and another end of each of the bonding wires is electrically connected to the conductor post.

5. A semiconductor device comprising:
   a semiconductor substrate having a device fabricated therein;
   an insulating layer formed on a surface of the semiconductor substrate, and having an opening from which an electrode pad of the device is exposed;
   a conductor post formed on an external terminal pad defined by a portion of a conductor layer formed on the insulating layer;
   a bonding wire having one end thereof connected to the electrode pad and having another end thereof buried in a floating state in the conductor post;
   an encapsulation resin layer formed to coat a region on the semiconductor substrate in which the conductor post is formed, and to expose a top portion of the conductor post; and
   an external connecting terminal bonded to the top portion of the conductor post.

6. The semiconductor device according to claim 5, wherein one end of each of a plurality of bonding wires is connected to a corresponding one of a plurality of electrode pads of the device, and another end of each of the bonding wires is electrically connected to the conductor post.

7. A method of manufacturing a semiconductor device, comprising:
   preparing a semiconductor wafer having a plurality of devices fabricated therein;
   forming an insulating layer having a plurality of openings from which a plurality of electrode pads of each device are exposed, on a surface of the semiconductor wafer on the side in which the devices are fabricated, and further forming a seed layer on the insulating layer;
   forming a wiring layer in a desired shape by patterning, in a region of the seed layer containing some of the plurality of openings, and forming an external terminal pad in another region of the seed layer;
   connecting a portion of the seed layer on each of the electrode pads exposed from remaining ones of the plurality of openings, to the external terminal pad by means of a bonding wire;
   forming conductor posts on a terminal formation portion of the wiring layer and the external terminal pad, respectively;
   forming a protection film to coat the wiring layer, in a region in which the conductor posts are not formed;
   encapsulating with an encapsulation resin a remaining portion which is not coated with the protection film, while exposing top portions of the conductor posts; and
   bonding external connecting terminals to the top portions of the conductor posts, and dividing the semiconductor wafer having the external connecting terminals bonded thereto into individual device units.

8. The method of manufacturing a semiconductor device, according to claim 7, wherein, when connecting by means of a bonding wire, one end of the bonding wire is connected to a portion of the seed layer on the electrode pad, and another end of the bonding wire is connected to a portion close to the center of the external terminal pad, and, when forming a conductor post on the external terminal pad, the conductor post is formed to bury another end of the bonding wire therein.

9. A method of manufacturing a semiconductor device, comprising:

preparing a semiconductor wafer having a plurality of devices fabricated therein;

forming an insulating layer having a plurality of openings from which a plurality of electrode pads of each device are exposed, on a surface of the semiconductor wafer on the side in which the devices are fabricated, and further forming a seed layer on the insulating layer;

connecting one end of a bonding wire having another end in a floating state, to a portion of the seed layer on each of the electrode pads exposed from some of the plurality of openings;

forming a wiring layer in a desired shape by patterning, in a region of the seed layer containing remaining ones of the plurality of openings, and forming an external terminal pad in another region of the seed layer;

forming conductor posts on a terminal formation portion of the wiring layer and the external terminal pad, respectively;

forming a protection film to coat the wiring layer, in a region in which the conductor posts are not formed;

encapsulating with an encapsulation resin a remaining portion which is not coated with the protection film, while exposing top portions of the conductor posts; and bonding external connecting terminals to the top portions of the conductor posts, and dividing the semiconductor wafer having the external connecting terminals bonded thereto, into individual device units.

* * * * *